United States Patent
Pohl et al.

(10) Patent No.: US 10,333,640 B2
(45) Date of Patent: Jun. 25, 2019

(54) RANGE EXTENSION FOR COMBINED DATA AND POWER LINE

(71) Applicant: BECKHOFF AUTOMATION GMBH, Verl (DE)

(72) Inventors: Christopher Pohl, Verl (DE); Martin Rostan, Nuremberg (DE); Thomas Rettig, Rheda-Wiedenbrueck (DE); Johannes Kuenne, Rheda-Wiedenbrueck (DE)

(73) Assignee: Beckhoff Automation GmbH, Verl (DE)

( * ) Notice: Subject to any disclaimer, the term of this patent is extended or adjusted under 35 U.S.C. 154(b) by 8 days.

(21) Appl. No.: 15/637,337

(22) Filed: Jun. 29, 2017

(65) Prior Publication Data

US 2018/0013504 A1    Jan. 11, 2018

(30) Foreign Application Priority Data

Jul. 6, 2016    (DE) .......... 10 2016 112 362

(51) Int. Cl.
| | |
|---|---|
| *H04H 20/84* | (2008.01) |
| *H02J 3/02* | (2006.01) |
| *G11C 5/14* | (2006.01) |
| *H01F 38/14* | (2006.01) |
| *H02M 3/07* | (2006.01) |
| *H04B 3/54* | (2006.01) |
| *H02M 3/156* | (2006.01) |

(52) U.S. Cl.
CPC ............ *H04H 20/84* (2013.01); *G11C 5/145* (2013.01); *H01F 38/14* (2013.01); *H02J 3/02* (2013.01); *H02M 3/07* (2013.01); *H04B 3/54* (2013.01); *H02M 3/156* (2013.01)

(58) Field of Classification Search
CPC ......... H04H 20/84; G11C 5/145; H01F 38/14; H02J 3/02; H02M 3/07; H02M 3/156; H04B 3/54
See application file for complete search history.

(56) References Cited

U.S. PATENT DOCUMENTS

| | | | | |
|---|---|---|---|---|
| 8,755,449 | B2 * | 6/2014 | Maniktala | H04B 3/56 375/258 |
| 9,069,539 | B2 * | 6/2015 | Schlichter | G06F 1/3203 |
| 9,094,218 | B2 * | 7/2015 | Schlichter | H04L 12/40045 |
| 2002/0109585 | A1 * | 8/2002 | Sanderson | H04B 3/58 455/7 |
| 2005/0169056 | A1 * | 8/2005 | Berkman | G02B 6/483 365/185.22 |
| 2008/0290729 | A1 * | 11/2008 | Schoenberg | H04B 3/36 307/3 |

(Continued)

FOREIGN PATENT DOCUMENTS

| | | |
|---|---|---|
| DE | 102011087828 A1 | 6/2013 |
| DE | 102015105702 B3 | 8/2016 |

*Primary Examiner* — Thomas D Alunkal
(74) *Attorney, Agent, or Firm* — Doresy & Whitney LLP

(57) ABSTRACT

An apparatus and a method for range extension for a combined data and power line are provided. Further, a bus system is provided. The design is based on a supply voltage that is transmitted via the combined data and power line being refreshed by a charge pump. Further, there may be provision, by way of example, for a data signal that is transmitted via the combined data and power line to be refreshed using the likewise transmitted supply voltage.

25 Claims, 3 Drawing Sheets

(56) References Cited

U.S. PATENT DOCUMENTS

| | | | |
|---|---|---|---|
| 2010/0277293 A1* | 11/2010 | Yu ........................... | H04L 12/10 333/24 R |
| 2013/0254565 A1* | 9/2013 | Yu ........................... | G06F 1/266 713/300 |
| 2014/0292081 A1* | 10/2014 | Long .................... | H02M 3/156 307/24 |

* cited by examiner

US 10,333,640 B2

RANGE EXTENSION FOR COMBINED DATA AND POWER LINE

CROSS-REFERENCE TO RELATED APPLICATION

This application claims priority to German patent application DE 10 2016 112 362.5, filed Jul. 6, 2017, entitled KONZEPT ZUR REICHWEITENVERLÄNGERUNG FÜR EINE KOMBINIERTE DATEN-UND ENERGIELEITUNG, the disclosure content of which is hereby incorporated by reference in its entirety and for all purposes.

FIELD

The invention relates to an apparatus for range extension for a combined data and power line. The invention further relates to a method for range extension for a combined data and power line. The invention relates to a bus system.

BACKGROUND

German patent application DE 10 2015 105 702.6 filed on Apr. 14, 2015 shows a bus system, particularly for use in industrial automation, having a supply module and at least one load module that are connected via a four-wire data line and a DC power supply.

In the supply module and in the load module of the bus system, a respective combination of inductive and capacitive assemblies is used in order to apply two DC-isolated DC voltages to the four-wire data line. Using just a single cable that consists of the four-wire data line, it is thus possible for two DC-isolated direct currents in addition to two differential data signals to be transmitted in parallel on the two wire pairs of the data line. The functionality of the bus system is not altered, which means that any bus structures such as a star, line or ring are possible.

Copper-based data transmission methods are always restricted in their extent because the damping of the lines is always greater than zero in realistic environments. This means that the signal amplitude is lowered ever further as line length increases, and, upward of a defined length, is no longer distinguishable from noise. In the case of Ethernet, the maximum length of the lines is specified at 100 m, greater distances not being able to be spanned by this means.

SUMMARY

It is an object of the invention to provide an improved design for range extension for a combined data and power line.

EXAMPLES

According to one aspect, an apparatus for range extension for a combined data and power line is provided, comprising one or more of:
- a first port for connecting a first combined data and power line, wherein the first port has a first and a second electrical contact,
- a first charge pump for refreshing a DC voltage, wherein the first charge pump is connected via a first inductive assembly to the first and the second contact of the first port, so that the first charge pump can refresh a first DC supply voltage applied to the first and to the second contact of the first port,
- a second port for connecting a second combined data and power line, wherein the second port has a first and a second electrical contact,
- wherein the first charge pump is connected via a second inductive assembly to the first and the second contact of the second port in order to apply the refreshed first DC supply voltage to the first and to the second contact of the second port,
- a first physical interface for receiving a first differential data signal, wherein the first physical interface is connected via a first transformer and a first capacitive assembly to the first and the second contact of the first port in order to receive a first differential data signal applied to the first contact and the second contact of the first port, and
- a second physical interface connected to the first physical interface for providing the first differential data signal, wherein the second physical interface is connected via a second transformer and a second capacitive assembly to the first and the second contact of the second port in order to apply the first differential data signal to the first contact and to the second contact of the second port.

According to a further aspect, a method for range extension for a combined data and power line using the apparatus for range extension for a combined data and power line is provided, comprising one of more of the following steps:
- applying a first DC supply voltage to the first and to the second contact of the first port,
- refreshing the first DC supply voltage applied to the first and to the second contact of the first port, by or by or by means of the first charge pump,
- applying the refreshed first DC supply voltage to the first and to the second contact of the second port by or by or by means of the first charge pump,
- receiving a first differential data signal applied to the first contact and the second contact of the first port, by or by or by means of the first physical interface,
- forwarding the received first differential data signal to the second physical interface, and
- applying the first differential data signal to the first contact and to the second contact of the second port by or by or by means of the second physical interface.

In accordance with a further aspect, a bus system is provided, comprising one or more of:
- a supply module for supplying a first DC supply voltage and a first differential data signal to a first combined data and power line,
- the apparatus for range extension for a combined data and power line, in order to connect the first combined data and power line to a second combined data and power line, and
- a load module for receiving the first DC supply voltage and the first differential data signal from the second combined data and power line.

In various examples and embodiments, a first DC supply voltage transmitted via the first combined data and power line is refreshed by or by or by means of a charge pump before it is supplied again to the second combined data and power line. This brings about particularly, the technical advantage that a range for a power transmission can be efficiently increased. In particular, it brings about the technical advantage that an efficient design for range extension for a combined data and power line can be provided.

A combined data and power line in the context of this description encompasses particularly a line that comprises multiple conductors, e.g., wherein at least two of the multiple conductors are used to transmit both a differential data signal and a DC supply voltage.

Refreshing a first DC supply voltage in the context of this description encompasses particularly the first DC supply voltage is increased to a first voltage value higher than an instantaneous voltage value of the first DC supply voltage. This first voltage value corresponds, for example, to a first supply voltage value when the first DC supply voltage is supplied for the first time.

In one embodiment, there is provision for the first physical interface and the second physical interface to be connected by or by or by means of a processing unit for processing the first differential data signal. The two interfaces are thus connected indirectly by or by means of the processing unit. This brings about particularly the technical advantage that the first differential data signal can be processed.

Processing in the context of this description comprises, for example, decoding and/or coding of a message that is included in the first differential data signal. The processing unit turns the apparatus into an active subscriber to the bus system, in so far as the apparatus can participate in a communication by the bus system.

In one embodiment, there is provision for the supply module to be connected to the load module by or by means of the apparatus for range extension for a combined data and power line. That is to say, for example, that the supply module can be connected by or by means of a first combined data and power line to the apparatus for range extension for a combined data and power line, the apparatus for range extension for a combined data and power line being connected to the load module by or by means of a second combined data and power line. By way of example, there is provision for multiple apparatuses for range extension for a combined data and power line to be connected in succession by or by means of multiple combined data and power lines, the load module being connected to the last apparatus of the successively connected apparatuses by or by means of a further combined data and power line.

In accordance with one embodiment, there is provision for a voltmeter for measuring a voltage applied to the first and to the second contact of the first port to be provided, wherein the processing unit is configured to insert a first voltage value corresponding to the measured voltage into the first differential data signal. The first data signal with the inserted first voltage value is then applied to the first and to the second contact of the second port by or by means of the second physical interface, for example, and can thus be forwarded via the second combined data and power line.

This brings about particularly the technical advantage that the first voltage value can be made available remotely by the apparatus efficiently. The measured voltage is, for example, the first DC supply voltage.

In accordance with another embodiment, there is provision for an ammeter for measuring an electric current corresponding to a voltage applied to the first and to the second contact of the first port to be provided, wherein the processing unit is configured to insert a first current value corresponding to the measured electric current into the first differential data signal. The first data signal with the inserted first current value is then applied to the first and to the second contact of the second port by or by means of the second physical interface, for example, and can thus be forwarded via the second combined data and power line.

This brings about particularly the technical advantage that the first current value can be made available remotely by the apparatus efficiently. The measured current is, for example, an electric current that flows between the first or, respectively, second contact of the first port and the first inductive assembly.

In accordance with another embodiment, there is provision for a thermometer for measuring a temperature of one of the electronic elements of the apparatus to be provided, wherein the processing unit is configured to insert a temperature value corresponding to the measured temperature into the first differential data signal. The first data signal with the inserted temperature value is then applied to the first and to the second contact of the second port by or by means of the second physical interface, for example, and can thus be forwarded via the second combined data and power line.

This brings about particularly the technical advantage that the temperature value can be made available remotely by the apparatus efficiently. The electronic elements encompass particularly the following electronic elements: first inductive assembly, second inductive assembly, first capacitive assembly, second capacitive assembly, first transformer, second transformer, first physical interface, second physical interface, first charge pump, processing unit.

In accordance with a further embodiment, there is provision for the processing unit to be configured to refresh the first differential data signal. This brings about particularly the technical advantage that a range of a data transmission can be efficiently increased. In particular, this brings about the technical advantage that an efficient design for range extension for a combined data and power line can be provided.

Refreshing a first differential data signal in the context of this description encompasses particularly that a signal level of the first data signal is increased to a first signal level value higher than an instantaneous signal level value. This first signal level value corresponds, for example, to a signal level value when the first differential data signal is supplied for the first time.

According to another embodiment, there is provision for the first DC supply voltage or, respectively, the refreshed first DC supply voltage to be used for refreshing the first differential data signal. That is to say particularly that the electric power that is transmitted by or by means of the first combined data and power line can be used for refreshing the first differential data signal. That is to say particularly that the processing device can be electrically conductively connected to a first power path formed between the first inductive assembly and the first charge pump, in order to tap off the first DC supply voltage in part. That is to say particularly that the processing device can be electrically conductively connected to a second power path formed between the first charge pump and the second inductive assembly, in order to tap off the refreshed first DC supply voltage in part. This brings about particularly the technical advantage that the apparatus does not still additionally need to be connected to an external power grid.

In another embodiment, there is provision for refreshing of the first DC supply voltage by or by means of the first charge pump to be configured to be able to be switched on and off. This brings about particularly the technical advantage that the refreshing can be switched on or off as required.

The switching-on and switching-off is performed, according to one embodiment, by or by means of a mechanical and/or electronic switch. That is to say that, according to one embodiment, a mechanical and/or electronic switch for switching the refreshing on and off is or, respectively, are provided.

The switch(es) is/are controlled, according to one embodiment, via the data signal. That is to say, by way of example, that a control command for controlling the switch(es) is coded in the first and/or second data signal. The processing unit decodes this control command and controls the switch(es) accordingly. The switch(es) can therefore be actuated via a bus system.

According to a further embodiment, there is provision for the processing unit to be configured to control the switching-on and switching-off. This brings about particularly the technical advantage that the switching-on and switching-off can be controlled efficiently.

In accordance with one embodiment, there is provision for a power supply unit for supplying the first charge pump with electric power to be provided. This brings about particularly the technical advantage that the first DC supply voltage can be refreshed efficiently. In particular, this brings about the technical advantage that a higher electrical output can be provided by or by means of the refreshed first DC supply voltage than without an additional supply of electric power to the first charge pump.

In one embodiment, there is provision for the first charge pump to be configured to refresh the first DC supply voltage only when the first DC supply voltage is lower than or lower than/the same as a predetermined first supply voltage threshold value. This brings about particularly the technical advantage that the refreshing can be performed efficiently. This is because a charge pump normally has an efficiency of less than 1, and it therefore makes sense for the charge pump not to be used constantly to achieve efficient operation.

According to a further embodiment, there is provision for the first port to have a third and a fourth contact, wherein a second charge pump is connected via a third inductive assembly to the third and the fourth contact of the first port, so that the second charge pump can refresh a second DC supply voltage applied to the third and to the fourth contact of the first port, wherein the second port has a third and a fourth electrical contact, wherein the second charge pump is connected via a fourth inductive assembly to the third and the fourth contact of the second port in order to apply the refreshed second DC supply voltage to the third and to the fourth contact of the second port, wherein the first physical interface is connected via a third transformer and a third capacitive assembly to the third and the fourth contact of the first port in order to receive a second differential data signal applied to the third contact and the fourth contact of the first port, and wherein the second physical interface is connected via a fourth transformer and a fourth capacitive assembly to the third and the fourth contact of the second port in order to apply the second differential data signal to the third contact and to the fourth contact of the second port.

That is to say that the second DC supply voltage transmitted via the first combined data and power line can be refreshed by or by means of the second charge pump before it is supplied again to the second combined data and power line. This brings about particularly the technical advantage that a range of a power transmission can be increased efficiently. In particular, this brings about the technical advantage that an efficient design for range extension for a combined data and power line is provided. The second physical interface thus preferably provides the received second differential data signal.

Refreshing a second DC supply voltage in the context of this description encompasses particularly that the second DC supply voltage is increased to a second voltage value higher than an instantaneous voltage value of the second DC supply voltage. This second voltage value corresponds, for example, to a second supply voltage value when the second DC supply voltage is supplied for the first time.

Embodiments that relate to the first DC supply voltage or, respectively, the first data signal apply analogously to the second DC supply voltage or, respectively, the second data signal, and vice versa.

In one embodiment, there is provision for the processing unit to be configured to process the second differential data signal. This brings about particularly the technical advantage that the second differential data signal can be processed.

Processing in the context of this description comprises, for example, decoding and/or coding a message that is included in the second differential data signal.

In accordance with one embodiment, there is provision for a voltmeter for measuring a voltage applied to the third and to the fourth contact to be provided, wherein the processing unit is configured to insert a second voltage value corresponding to the measured voltage into the first or, respectively, into the second differential data signal. The first or, respectively, the second data signal with the inserted second voltage value is then applied to the first and to the second or, respectively, to the third and to the fourth contact of the second port by or by means of the second physical interface, for example, and can thus be forwarded via the second combined data and power line.

This brings about particularly the technical advantage that the second voltage value can be made available remotely by the apparatus efficiently. The measured voltage is, for example, the second DC supply voltage.

In accordance with another embodiment, there is provision for an ammeter for measuring an electric current corresponding to a voltage applied to the third and to the fourth contact to be provided, wherein the processing unit is configured to insert a second current value corresponding to the measured electric current into the first or, respectively, into the second differential data signal. The first or, respectively, the second data signal with the inserted second current value is then applied to the first and to the second or, respectively, to the third and to the fourth contact of the second port by or by means of the second physical interface, for example, and can thus be forwarded via the second combined data and power line.

This brings about particularly the technical advantage that the second current value can be made available remotely by the apparatus efficiently. The measured current is, for example, an electric current that flows between the third or, respectively, fourth contact of the first port and the third inductive assembly.

In accordance with another embodiment, there is provision for a thermometer for measuring a temperature of one of the electronic elements of the apparatus to be provided, wherein the processing unit is configured to insert a temperature value corresponding to the measured temperature into the first or, respectively, second differential data signal. The first or, respectively, the second data signal with the inserted temperature value is then applied to the first and to the second or, respectively, to the third and to the fourth contact of the second port by or by means of the second physical interface, for example, and can thus be forwarded via the second combined data and power line.

This brings about particularly the technical advantage that the temperature value can be made available remotely by the apparatus efficiently. The electronic elements encompass particularly the following electronic elements: first inductive assembly, second inductive assembly, first capacitive assembly, second capacitive assembly, first transformer, second transformer, first physical interface, second physical interface, first charge pump, processing unit, third inductive assembly, fourth inductive assembly, third capacitive assembly, fourth capacitive assembly, second charge pump.

In accordance with a further embodiment, there is provision for the processing unit to be configured to refresh the second differential data signal. This brings about particularly the technical advantage that a range of a data transmission can be increased efficiently. In particular, this brings about the technical advantage that an efficient design for range extension for a combined data and power line is provided.

Refreshing a second differential data signal in the context of this description encompasses particularly that a signal level of the second data signal is increased to a second signal level value higher than an instantaneous signal level value. This second signal level value corresponds, for example, to a signal level value when the second differential data signal is supplied for the first time.

According to another embodiment, there is provision for the first DC supply voltage or, respectively, the refreshed first DC supply voltage or, respectively, the second DC supply voltage or, respectively, the refreshed second DC supply voltage to be used for refreshing the first or, respectively, second differential data signal. That is to say particularly that the electric power that is transmitted by or by means of the first combined data and power line can be used for refreshing the first or, respectively, second differential data signal. That is to say particularly that the processing device can be electrically conductively connected to a third power path formed between the third inductive assembly and the second charge pump, in order to tap off the second DC supply voltage in part. That is to say particularly that the processing device can be electrically conductively connected to a fourth power path formed between the second charge pump and the fourth inductive assembly, in order to tap off the refreshed second DC supply voltage in part. This brings about particularly the technical advantage that the apparatus does not still additionally need to be connected to an external power grid.

In another embodiment, there is provision for refreshing of the second DC supply voltage by or by means of the second charge pump to be configured to be able to be switched on and off. This brings about particularly the technical advantage that the refreshing can be switched on or off as required.

The switching-on and switching-off is, according to one embodiment, performed by or by means of a mechanical and/or electronic switch. That is to say that, according to one embodiment, a mechanical and/or electronic switch for switching the refreshing on and off is or, respectively, are provided.

The switch(es) is/are, according to one embodiment, controlled via the data signal. That is to say, by way of example, that a control command for controlling the switch(es) is coded in the first and/or second data signal. The processing unit decodes this control command and controls the switch(es) accordingly. The switch(es) can therefore be actuated via a bus system.

According to a further embodiment, there is provision for the processing unit to be configured to control the switching-on and switching-off. This brings about particularly the technical advantage that the switching-on and switching-off can be controlled efficiently.

In accordance with one embodiment, there is provision for a power supply unit for supplying the second charge pump with electric power to be provided. This brings about particularly the technical advantage that the second DC supply voltage can be refreshed efficiently. In particular, this can bring about the technical advantage that a higher electrical output can be provided by or by means of the refreshed second DC supply voltage than without an additional supply of electric power to the second charge pump.

The power supply unit that supplies the first charge pump with electric power is, by way of example, different than the power supply unit that supplies the second charge pump with electric power. In this case, the power supply unit that supplies the first charge pump with electric power can be referred to as the first power supply unit, and the power supply unit that supplies the second charge pump with electric power can be referred to as the second power supply unit.

In one embodiment, the second charge pump is supplied with electric power using the same power supply unit as is provided for supplying the first charge pump with electric power. That is to say particularly that, in one embodiment, a shared power supply unit for supplying the first charge pump and for supplying the second charge pump with electric power is provided.

In one embodiment, there is provision for the second charge pump to be configured to refresh the second DC supply voltage only when the second DC supply voltage is lower than or lower than/the same as a predetermined second supply voltage threshold value. This brings about particularly the technical advantage that the refreshing can be performed efficiently. This is because a charge pump normally has an efficiency of less than 1, and it therefore makes sense for the charge pump not to be used constantly to achieve efficient operation.

In one embodiment, there is provision for the first charge pump and the second charge pump to be identical, and there is thus only a single charge pump provided: the first charge pump is the second charge pump. That is to say particularly that a shared charge pump is used in order to refresh the first and the second DC supply voltage. The fact that the first charge pump and the second charge pump may be identical means particularly that the functionalities of the first and second charge pumps can be mapped in a single charge pump.

When there is only a single charge pump, there is provision, by way of example, for the two DC supply voltages to be or, respectively, to have been combined at a node or circuit node, so that effectively only a single DC voltage, the DC voltage resulting from the two combined DC supply voltages, is then refreshed by or by means of the single charge pump. After the refreshing, there is then provision, by way of example for the refreshed DC voltage to be split again at a further node or circuit node in order to produce two separate DC voltages that then correspond to the first and the second refreshed DC supply voltage respectively.

In a further embodiment, there is provision for the single DC supply voltage refreshed by or by means of the single charge pump to be applied to the four contacts of the second port, so that a split, as described above, into a first and a second refreshed DC supply voltage is or, respectively, has been forborne.

The bus system is, according to one embodiment, configured for use in industrial automation. The bus system is therefore, according to one embodiment, a bus system from industrial automation or a bus system for industrial automation.

Especially in industrial automation, such a bus system can be particularly advantageous. This is because the measured current or the measured voltage value can be used for an inexpensive and simple analysis at field level. Furthermore the refreshing of at least one DC supply voltage or, respectively, of the data signal affords the advantage that multiple different components (such as sensors or actuators, for example) having different voltages and data signals can be programmed and also operated at a relatively great distance.

According to one embodiment, particularly according to an embodiment of the bus system, the first differential data signal and the second differential data signal are each differential Ethernet signals. The bus system or, respectively, the supply module or, respectively, the load module is therefore particularly suitable for use with Ethernet as a communication standard in the automation network.

According to one embodiment of the bus system, an automation network is provided that comprises the bus system. According to one embodiment, the first or, respectively, the second differential data signal is an EtherCAT data signal, particularly an EtherCAT P data signal. The bus system is, for example, an EtherCAT bus system, particularly an EtherCAT P bus system.

In one embodiment, the first or, respectively, second charge pump comprises a controller that, by way of example, can measure or, respectively, measures the refreshed first or, respectively, second DC supply voltage. The controller is, by way of example, configured to provide the processing unit with a voltage value that corresponds to this measured refreshed DC supply voltage. The processing unit is, by way of example, configured to insert this voltage value into the first or, respectively, second data signal, for example. This allows this voltage value to be made available remotely by the apparatus.

Technical functionalities of the bus system or, respectively, of the method are obtained analogously from corresponding technical functionalities of the apparatus, and vice versa. That is to say particularly that features of the bus system or, respectively, of the method are obtained analogously from corresponding features of the apparatus, and vice versa.

The wording "or, respectively" encompasses particularly the wording "and/or."

The wording "connected" in the context of this description encompasses particularly "electrically conductively connected."

BRIEF DESCRIPTION OF THE DRAWINGS

The invention is explained in greater detail below on the basis of preferred exemplary embodiments with reference to figures, in which.

Identical reference signs may be used for identical features.

DETAILED DESCRIPTION

Figure 1:
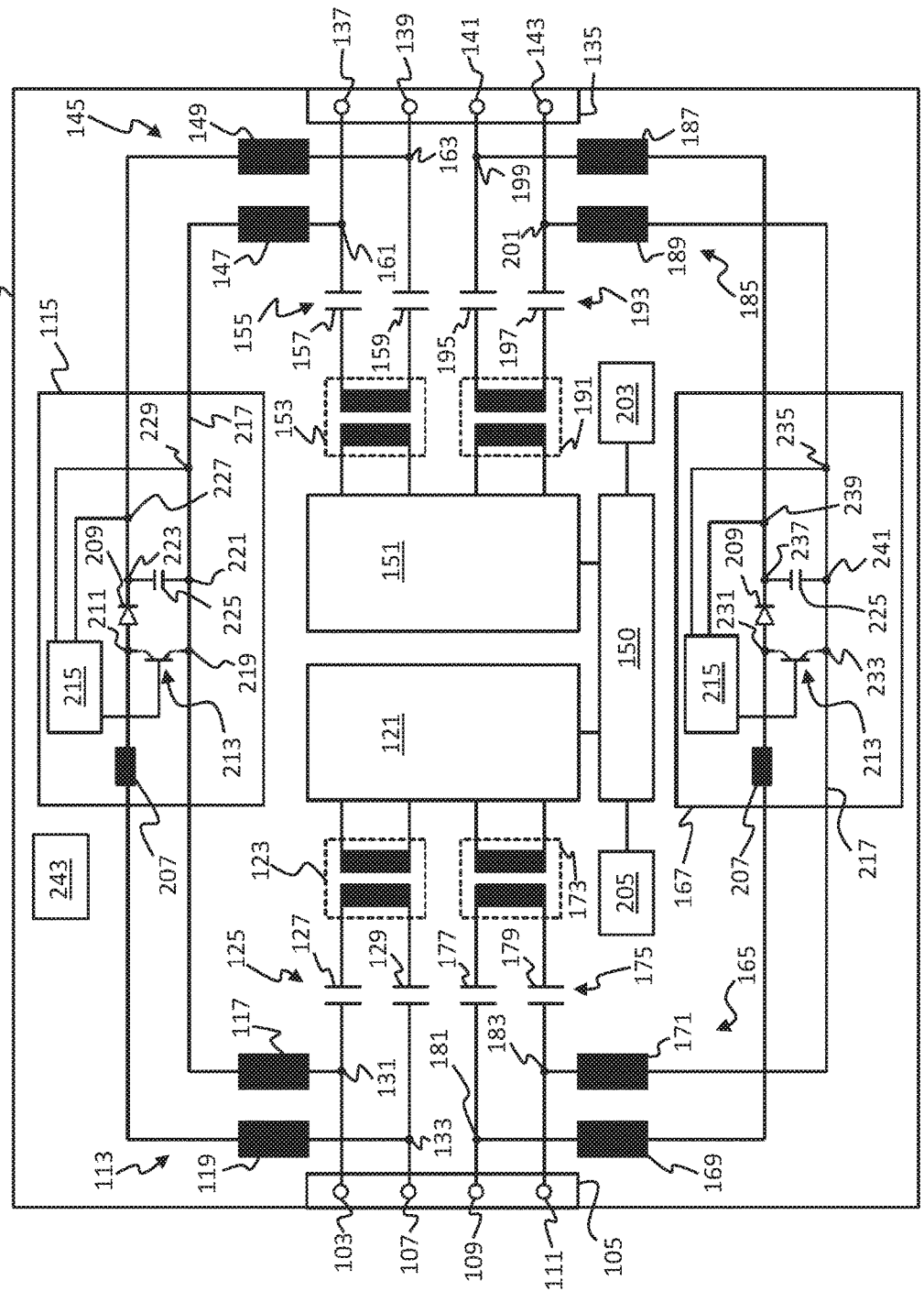
FIG. 1 shows an apparatus for range extension for a combined data and power line.

FIG. 1 shows an apparatus 101 for range extension for a combined data and power line. The apparatus 101 comprises a first port 103 for a first combined data and power line. The first port 103 comprises a first contact 105, a second contact 107, a third contact 109 and a fourth contact 111.

The apparatus 101 further comprises a first inductive assembly 113 and a first charge pump 115 for refreshing a DC voltage. The first charge pump 115 is connected to the first contact 105 and the second contact 107 of the first port 103 by or by means of the first inductive assembly 113 in order to refresh a first DC supply voltage applied to the first contact 105 and the second contact 107 of the first port 103.

The first inductive assembly 113 comprises a first inductance 117 and a second inductance 119. The first inductance 117 of the first inductive assembly 113 is connected or arranged between the first charge pump 115 and the first contact 105 of the first port 103. The second inductance 119 of the first inductive assembly 113 is connected or arranged between the first charge pump 115 and the second contact 107 of the first port 103.

The apparatus 101 further comprises a first physical interface 121, which can also be referred to as a PHY. The first physical interface 121 is connected via a first transformer 123 and via a first capacitive assembly 125 to the first contact 105 and the second contact 107 of the first port 103, so that the physical interface 121 can receive a first differential data signal applied to the two contacts 105, 107.

The first capacitive assembly 125 comprises a first capacitor 127 and a second capacitor 129. The first capacitor 127 of the first capacitive assembly 125 is connected or arranged between the first transformer 123 and the first contact 105 of the first port 103. The second capacitor 129 of the first capacitive assembly 125 is connected or arranged between the first transformer 123 and the second contact 107 of the first port 103.

The first capacitor 127 of the first capacitive assembly 125 and the first contact 105 of the first port 103 have a first circuit node 131 formed between them. The second capacitor 129 of the first capacitive assembly 125 and the second contact 107 of the first port 103 have a second circuit node 133 formed between them.

The first inductance 117 of the first inductive assembly 113 is connected to the first circuit node 131. The second inductance 119 of the first inductive assembly 113 is connected to the second circuit node 133.

The apparatus 101 comprises a second port 135 for a second combined data and power line. The second port 135 comprises a first contact 137, a second contact 139, a third contact 141 and a fourth contact 143.

The apparatus 101 further comprises a second inductive assembly 145. The first charge pump 115 is connected to the first contact 137 and the second contact 139 of the second port 135 by or by means of the second inductive assembly 145 in order to apply the refreshed first DC supply voltage to the first contact 137 and to the second contact 139 of the second port 135.

The second inductive assembly 145 comprises a first inductance 147 and a second inductance 149. The first inductance 147 of the second inductive assembly 145 is connected or arranged between the first charge pump 115 and the first contact 137 of the second port 135. The second inductance 149 of the second inductive assembly 145 is connected or arranged between the first charge pump 115 and the second contact 139 of the second port 135.

The apparatus 101 further comprises a second physical interface 151, which can also be referred to as a PHY. The first physical interface 121 and the second physical interface 151 are connected by or by means of a processing unit 150. The processing unit 150 is particularly configured to receive the first data signal from the first physical interface 121 and to forward it to the second physical interface 151. In particular, the processing unit 150 is configured to process the first data signal and to forward the processed first data signal to the second physical interface 151.

The second physical interface 151 is connected via a second transformer 153 and via a second capacitive assembly 155 to the first contact 137 and the second contact 139 of the second port 135, so that the second physical interface 151 can apply the first differential data signal or, respectively, the processed first data signal to the two contacts 137, 139.

The second capacitive assembly 155 comprises a first capacitor 157 and a second capacitor 159. The first capacitor 157 of the second capacitive assembly 155 is connected or arranged between the second transformer 153 and the first contact 137 of the second port 135. The second capacitor 159 of the second capacitive assembly 155 is connected or arranged between the second transformer 153 and the second contact 139 of the second port 135.

The first capacitor 157 of the second capacitive assembly 155 and the first contact 137 of the second port 135 have a third circuit node 161 formed between them. The second capacitor 159 of the second capacitive assembly 155 and the second contact 139 of the second port 135 have a fourth circuit node 163 formed between them.

The first inductance 147 of the second inductive assembly 145 is connected to the third circuit node 161. The second inductance 149 of the second inductive assembly 145 is connected to the fourth circuit node 161.

The apparatus 101 further comprises a third inductive assembly 165 and a second charge pump 167 for refreshing a DC voltage. The second charge pump 167 is connected by or by means of the third inductive assembly 165 to the third contact 109 and the fourth contact 111 of the first port 103 in order to refresh a second DC supply voltage applied to the third contact 109 and the fourth contact 111 of the first port 103.

The third inductive assembly 165 comprises a first inductance 169 and a second inductance 171. The first inductance 169 of the third inductive assembly 165 is connected or arranged between the second charge pump 167 and the third contact 109 of the first port 103. The second inductance 171 of the third inductive assembly 165 is connected or arranged between the second charge pump 167 and the fourth contact 111 of the first port 103.

The first physical interface 121 is connected via a third transformer 173 and via a third capacitive assembly 175 to the third contact 109 and the fourth contact 111 of the first port 103, so that the first physical interface 121 can receive a second differential data signal applied to the two contacts 109, 111.

The third capacitive assembly 175 comprises a first capacitor 177 and a second capacitor 179. The first capacitor 177 of the third capacitive assembly 175 is connected or arranged between the third transformer 173 and the third contact 109 of the first port 103. The second capacitor 179 of the third capacitive assembly 175 is connected or arranged between the third transformer 173 and the fourth contact 111 of the first port 103.

The first capacitor 177 of the third capacitive assembly 175 and the third contact 109 of the first port 103 have a fifth circuit node 181 formed between them. The second capacitor 179 of the third capacitive assembly 175 and the fourth contact 111 of the first port 103 have a sixth circuit node 183 formed between them.

The first inductance 169 of the third inductive assembly 165 is connected to the fifth circuit node 181. The second inductance 171 of the third inductive assembly 165 is connected to the sixth circuit node 183.

The apparatus 101 further comprises a fourth inductive assembly 185. The second charge pump 167 is connected by or by means of the fourth inductive assembly 185 to the third contact 141 and the fourth contact 143 of the second port 135 in order to apply the refreshed second DC supply voltage to the third contact 141 and to the fourth contact 143 of the second port 135.

The fourth inductive assembly 185 comprises a first inductance 187 and a second inductance 189. The first inductance 187 of the fourth inductive assembly 185 is connected or arranged between the second charge pump 167 and the third contact 141 of the second port 135. The second inductance 189 of the fourth inductive assembly 185 is connected or arranged between the second charge pump 167 and the fourth contact 143 of the second port 135.

The processing unit 150 is particularly configured to receive the second data signal from the first physical interface 121 and to forward it to the second physical interface 151. In particular, the processing unit 150 is configured to process the second data signal and to forward the processed second data signal to the second physical interface 151.

The second physical interface 151 is connected via a fourth transformer 191 and via a fourth capacitive assembly 193 to the third contact 141 and the fourth contact 143 of the second port 135, so that the second physical interface 151 can apply the second differential data signal or, respectively, the processed second data signal to the two contacts 141, 143 of the second port 135.

The fourth capacitive assembly 193 comprises a first capacitor 195 and a second capacitor 197. The first capacitor 195 of the fourth capacitive assembly 193 is connected or arranged between the fourth transformer 191 and the third contact 141 of the second port 135. The second capacitor 197 of the fourth capacitive assembly 193 is connected or arranged between the fourth transformer 191 and the fourth contact 143 of the second port 135.

The first capacitor 195 of the fourth capacitive assembly 193 and the third contact 141 of the second port 135 have a seventh circuit node 199 formed between them. The second capacitor 197 of the fourth capacitive assembly 193 and the fourth contact 143 of the second port 135 have an eighth circuit node 201 formed between them.

The first inductance 187 of the fourth inductive assembly 185 is connected to the seventh circuit node 199. The second inductance 189 of the fourth inductive assembly 185 is connected to the eighth circuit node 201.

Hence, it is advantageously made possible for the apparatus 101 to firstly be able to use the four contacts 105, 107, 109, 111 of the first port 103 to receive two DC supply voltages, to be able to refresh these by or by means of the first charge pump 115 and the second charge pump 167 and to be able to apply the refreshed DC supply voltages to the four contacts 137, 139, 141, 143 of the second port 135.

The functionality of the two charge pumps 115, 167 is, according to one embodiment, mapped in a single charge pump. That is to say particularly that a single charge pump is provided that refreshes both DC supply voltages. In this case, there is particularly provision for both DC supply voltages to be combined at a circuit node, so that the single charge pump then refreshes only a single DC supply voltage. This refreshed DC supply voltage is then split into two separate DC supply voltages again at a further circuit node, so that the split DC supply voltages form the first and the second refreshed DC supply voltage, respectively.

In a further embodiment, there is provision for the single DC supply voltage refreshed by or by means of the single charge pump to be applied to the four contacts 137, 139, 141, 143 of the second port 135, so that a split, as described above, into a first and a second refreshed DC supply voltage is forborne.

Secondly, it is advantageously made possible for the apparatus 101 to be able to forward (with optional processing) the two differential data signals received via the four contacts 105, 107, 109, 111 of the first port 103 via the four contacts 137, 139, 141, 143 of the second port 135. This advantageously brings about an efficient range extension for a combined data and power line.

The inductive assemblies 113, 145, 165, 185 advantageously block the differential data signals, so that they are not applied to the charge pumps 115, 167. The capacitive assemblies 125, 155, 175, 193 advantageously block the DC supply voltages, so that they are not applied to the transformers 123, 153, 173, 191 or, respectively, the physical interfaces 121, 151.

The apparatus 101 further comprises an optional thermometer 203 that may be configured as a temperature sensor, for example. The thermometer 203 measures a temperature of one of the electronic elements of the apparatus 101. A temperature value corresponding to the measured temperature is inserted into the first or, respectively, second data signal by or by means of the processing unit 150, for example, so that the temperature value can be made available remotely by the apparatus 101.

The apparatus 101 further comprises an optional voltmeter 205 that may be configured as a voltage sensor, for example. The voltmeter 205 measures, by way of example, a voltage applied to the first contact 105 and to the second contact 107 of the first port 103, which voltage may be the first DC supply voltage, for example. The voltmeter 205 measures, by way of example, a voltage applied to the third contact 109 and to the fourth contact 111 of the first port 103, which voltage may be the second DC supply voltage, for example.

A voltage value corresponding to the measured voltage is inserted into the first or, respectively, second data signal by or by means of the processing unit 150, for example, so that the voltage value can be made available remotely by the apparatus 101. By way of example, multiple voltmeters for measuring the first and the second DC supply voltage are provided. FIG. 1 portrays only one voltmeter 205 for the purposes of illustration.

In an embodiment, the apparatus 101 further comprises an ammeter that may be configured as a current sensor, for example. The ammeter measures, by way of example, an electric current that flows between one of the contacts 105, 107, 109, 111 of the first port 103 and that one of the inductances 117, 119, 169, 171 that is connected to the relevant contact.

A current value corresponding to the measured current is inserted into the first or, respectively, second data signal by or by means of the processing unit 150, for example, so that the current value can be made available remotely by the apparatus 101. By way of example, multiple ammeters for measuring applicable electric currents are provided.

The first charge pump 115 and the second charge pump 167 may be configured identically. Therefore, the same reference symbols are used for the same features in part.

The first charge pump 115 comprises a resistor 207. The resistor 207 is connected to the second inductance 119 of the first inductive assembly 113.

The first charge pump 115 comprises a diode 209. The anode of the diode 209 is connected to the resistor 207. The resistor 207 is arranged between the anode of the diode 209 and the second inductance 119 of the first inductive assembly 113.

The cathode of the diode 209 is connected to the second inductance 149 of the second inductive assembly 145. The resistor 207 and the anode of the diode 209 have a ninth circuit node 211 formed between them.

The first charge pump 115 comprises an npn bipolar transistor 213. The collector of the npn bipolar transistor 213 is connected to the ninth circuit node 211. The circuit design of the charge pump can also involve other known transistor types being used. That is to say that, in a further embodiment, instead of the npn bipolar transistors 213, other transistor types, for example MOSFET, are used.

The first charge pump 115 comprises a controller 215 that can also be referred to as a control. The controller 215 is connected to the base of the npn bipolar transistor 213. In accordance with one embodiment, instead of the npn bipolar transistor 213, a MOSFET is provided, the controller 215 being connected to the gate of the MOSFET.

The first charge pump 115 comprises a conductor 217 that is connected to the first inductance 117 of the first inductive assembly 113 and to the first inductance 147 of the second inductive assembly 145. The conductor 217 comprises a tenth circuit node 219 that is connected to the emitter of the npn bipolar transistor 213. The conductor 217 comprises an eleventh circuit node 221 that is arranged between the $10^{th}$ circuit node 219 and the first inductance 147 of the second inductive assembly 145.

The first charge pump 115 further comprises a $12^{th}$ circuit node 223 that is arranged between the cathode of the diode 209 and the second inductance 149 of the second inductive assembly 145. The eleventh circuit node 221 and the $12^{th}$ circuit node 223 have a capacitor 225 arranged or connected between them.

The first charge pump 115 further comprises a $13^{th}$ circuit node 227 that is arranged between the $12^{th}$ circuit node 223 and the second inductance 149 of the second inductive assembly 145. The $13^{th}$ circuit node 227 is connected to the controller 215.

The first charge pump 115 further comprises a $14^{th}$ circuit node 229 that is arranged between the $11^{th}$ circuit node 221 and the first inductance 147 of the second inductive assembly 145. The $14^{th}$ circuit node 229 is connected to the controller 215.

Across the two circuit nodes 227, 229, the controller 215 can measure the refreshed first DC supply voltage. A voltage value that corresponds to this measured refreshed DC supply voltage is provided to the processing unit 150, for example, by the controller 215. The processing unit 150 inserts this voltage value into the first or, respectively, second data signal, for example. This allows this voltage value to be made available remotely by the apparatus 101.

The second charge pump 167 comprises a resistor 207. The resistor 207 is connected to the second inductance 169 of the third inductive assembly 165.

The second charge pump 167 comprises a diode 209. The anode of the diode 209 is connected to the resistor 207. The resistor 207 is arranged between the anode of the diode 209 and the second inductance 169 of the third inductive assembly 165.

The cathode of the diode 209 is connected to the first inductance 187 of the fourth inductive assembly 185. The resistor 207 and the anode of the diode 209 have a $15^{th}$ circuit node 231 formed between them.

The second charge pump 167 comprises an npn bipolar transistor 213. The collector of the npn bipolar transistor 213 is connected to the $15^{th}$ circuit node 231.

The second charge pump 167 comprises a controller 215 that can also be referred to as a control. The controller 215 is connected to the base of the npn bipolar transistor 213.

The second charge pump 167 comprises a conductor 217 that is connected to the second inductance 171 of the third inductive assembly 165 and to the second inductance 189 of the fourth inductive assembly 185. The conductor 217 comprises a $16^{th}$ circuit node 233 that is connected to the emitter of the npn bipolar transistor 213. The conductor 217 comprises a $17^{th}$ circuit node 235 that is arranged between the $16^{th}$ circuit node 233 and the second inductance 189 of the fourth inductive assembly 185.

The second charge pump 167 further comprises an $18^{th}$ circuit node 237 that is arranged between the cathode of the diode 209 and the first inductance 187 of the fourth inductive assembly 185. The $17^{th}$ circuit node 235 and the $18^{th}$ circuit node 237 have a capacitor 225 arranged or connected between them.

The second charge pump 167 further comprises a $19^{th}$ circuit node 239 that is arranged between the $18^{th}$ circuit node 237 and the first inductance 187 of the fourth inductive assembly 185. The $19^{th}$ circuit node 239 is connected to the controller 215.

The second charge pump 167 further comprises a $20^{th}$ circuit node 241 that is arranged between the $17^{th}$ circuit node 235 and the second inductance 189 of the fourth inductive assembly 185. The $20^{th}$ circuit node 241 is connected to the controller 215.

Across the two circuit nodes 239, 241, the controller 215 can measure the refreshed second DC supply voltage. A voltage value that corresponds to this measured DC supply voltage is provided to the processing unit 150, for example, by the controller 215. The processing unit 150 inserts this voltage value into the first or, respectively, second data signal, for example. This allows this voltage value to be made available remotely by the apparatus 101.

An inherently known pulse width modulation can be used by the respective controller 215 of the two charge pumps 115, 167 to switch the applicable npn bipolar transistor 213 and thus ultimately refresh the applicable DC supply voltage.

The apparatus 101 further comprises an optional power supply unit 243 for supplying the first or, respectively, second charge pump 115, 167 with electrical power. By way of example, each charge pump 115, 167 has a separate power supply unit provided for it.

Figure 2:
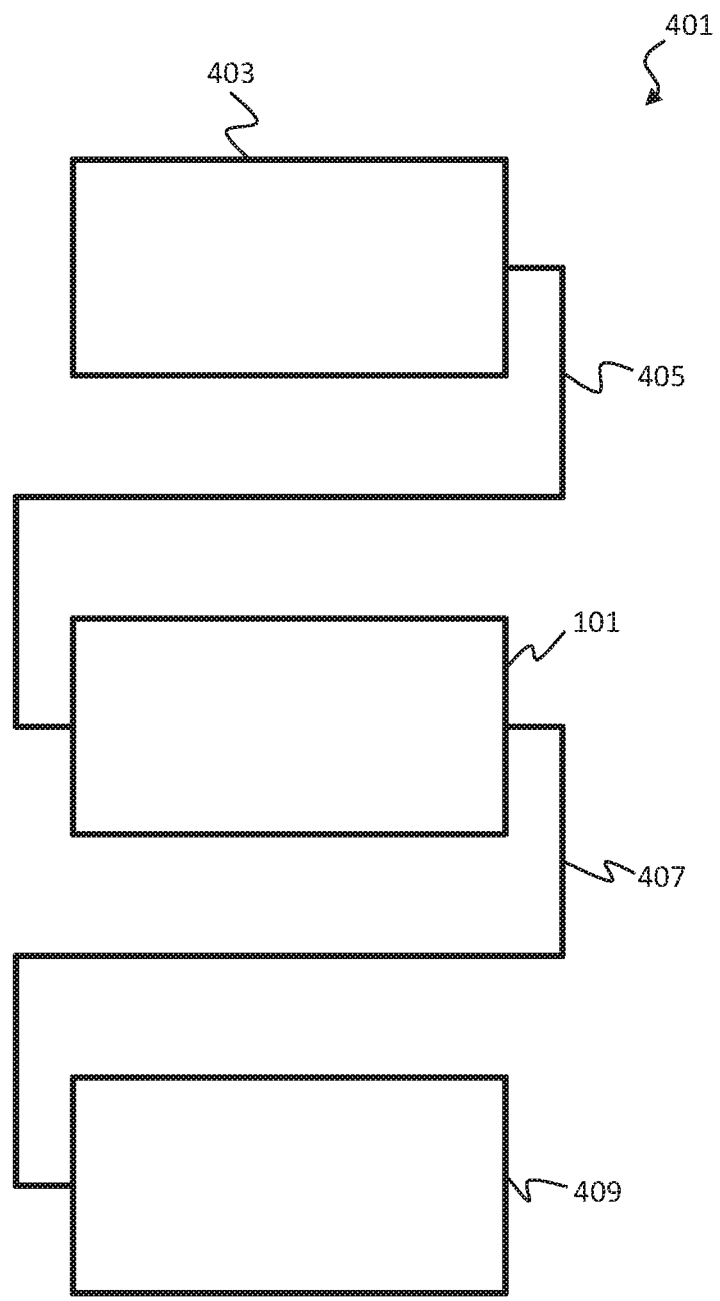
FIG. 2 shows a bus system.

FIG. 2 shows a bus system 401. The bus system 401 comprises a supply module 403. The supply module 403 is configured to provide a first and a second DC supply voltage. The supply module 403 comprises, for example, a first DC voltage source for providing the first DC supply voltage and a second DC voltage source for providing the second DC supply voltage.

The supply module 403 is connected to a first combined data and power line 405. The first combined data and power line 405 comprises four conductors that each have one end electrically conductively connected to a contact of a port of the supply module 403.

The supply module 403 supplies the two data signals and the two DC supply voltages to the first combined data and power line via capacitive assemblies, transformers and inductive assemblies analogously to the apparatus 101. A respective other end of the four conductors is electrically conductively connected to the contacts 105, 107, 109, 111 of the first port 103 of the apparatus 101 of FIG. 1.

FIG. 2 shows only a rectangle as a replacement for the apparatus 101 of FIG. 1 for the sake of clarity. The DC supply voltages supplied are refreshed by or by means of the charge pumps 115, 167 of the apparatus 101 and supplied to a second combined data and power line 407. The second combined data and power line 407 is configured analogously to the first combined data and power line 403. Accordingly, one respective end of the four conductors is electrically conductively connected to the contacts 137, 139, 141, 143 of the second port 135.

A respective other end of the four conductors is electrically conductively connected to respective contacts of a port of a load module 409. The load module 409 receives the two differential data signals and the two DC supply voltages that can be used to supply power to two respective DC loads, for example. The load module 409 comprises a first and a second DC load, for example.

The reception of the data signals and the DC supply voltages by or by means of the load module is carried out analogously to the corresponding reception by or by means of the apparatus 101, for example, that is to say particularly using capacitive assemblies, inductive assemblies, transformers and physical interfaces.

In an embodiment, more than one apparatus 101 is provided in order to extend the range of the data and power transmission. The multiple apparatuses are in this case connected in succession by or by means of combined data and power lines. In another embodiment, there is provision for an extension module to be used or, respectively, to have been used instead of an apparatus for range extension for a combined data and power line, wherein the extension module corresponds to the apparatus for range extension for a combined data and power line, for example, except for the charge pump. That is to say, by way of example, that the extension module is free of a charge pump. This advantageously allows costs to be saved. That is to say particularly that both an apparatus for range extension for a combined data and power line and an extension module may be connected in succession by or by means of combined data and power lines.

Figure 3:
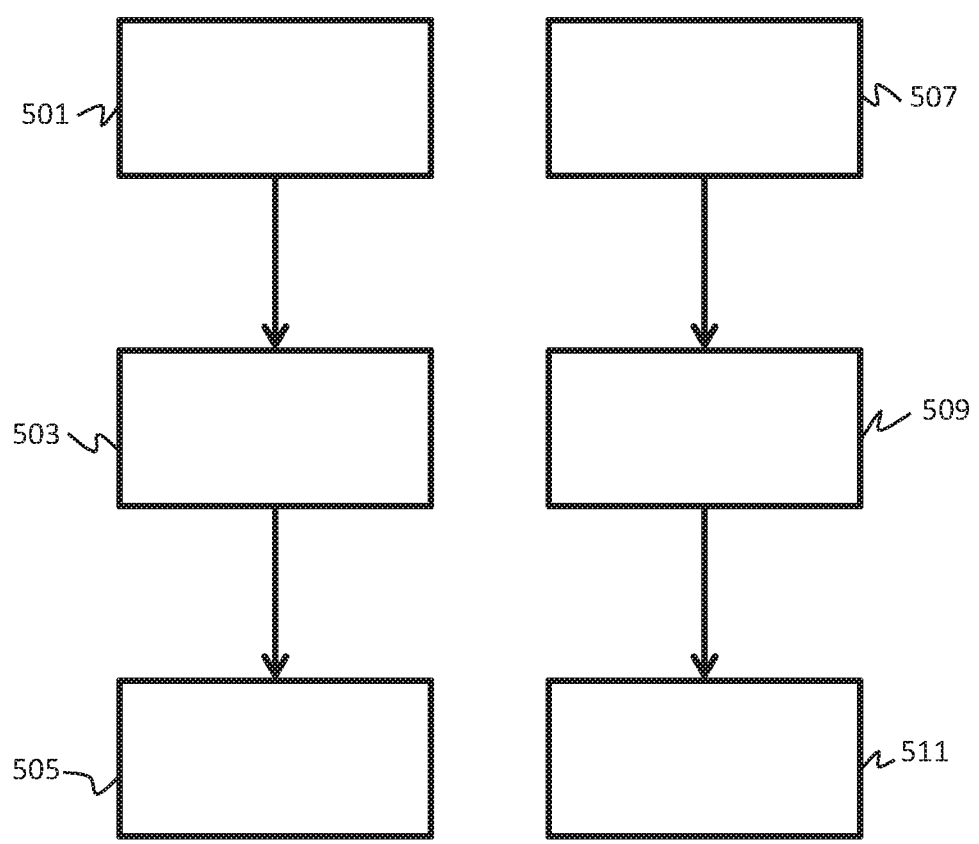
FIG. 3 shows a flowchart for a method for range extension.

FIG. 3 shows a flowchart for a method for range extension for a combined data and power line using an apparatus for range extension for a combined data and power line, for example the apparatus 101 of FIG. 1. The method comprises one or more of the following steps:

applying 501 a first DC supply voltage to the first 105 and to the second 107 contact of the first port 103, refreshing 503 the first DC supply voltage applied to the first 105 and to the second 107 contact of the first port 103, by or by means of the first charge pump 115, applying 505 the refreshed first DC supply voltage to the first 137 and to the second 139 contact of the second port 135 by or by means of the first charge pump 115, receiving 507 a first differential data signal applied to the first contact 105 and the second contact 107 of the first port 103, by or by means of the first physical interface 121, forwarding 509 the received first differential data signal to the second physical interface 151, applying 511 the first differential data signal to the first contact 137 and to the second contact 139 of the second port 135 by or by means of the second physical interface 151.

An efficient design is provided that can be used, for example for a bus system in which both a DC supply voltage and a differential data signal are transmitted via two conductors of one line, to set up an extension according to the scheme shown in FIGS. 1 and 2. The transmission methods provided may be or, respectively, are one or more of the following transmission methods, for example: PoE (Power over Ethernet), PoDL (Power over Data Lines), Powerline (also called PLC (Powerline communication)) and EtherCAT P.

The form of the coupling-in or, respectively, coupling-out of the DC supply voltages is configured particularly in line with the requirements of the transmission method. The processing unit between the individual physical interfaces is optional, in particular, and some devices (for example the two PHYs) can be connected to one another without a further control, for example, and thus act particularly as a repeater.

The optional processing unit within the apparatus, wherein the apparatus can also be referred to as an extension unit, is used, according to one embodiment, for observing each local node, that is to say particularly the individual elements of the apparatus, with, by way of example, the electric currents and/or the DC supply voltages of the local supply being measured and monitored. This advantageously allows not only the actual operation but also long-term changes in the bus system to be assessed, for example changing contact resistances, which allow conclusions as to the state of the bus system, for example.

An optional thermometer of the apparatus can be used for monitoring the charge pump(s), for example.

The apparatus has, by way of example, input/output ports for connecting external sensors or, respectively, actuators.

The charge pump, which can also be referred to as a step-up converter, can be used at multiple locations in the bus system, for example, in order to raise the DC supply voltage to a minimum again, that is to say refresh it, when it has dropped below a minimum voltage, for example. The position (for example upstream or downstream of a power supply unit of the apparatus) is in this case dependent particularly on the power loss to be expected. By way of example, the refreshing is configured to be able to be switched on or, respectively, off, for example controllable via the optional processing unit.

In one embodiment, particularly when the apparatus is provided for an EtherCAT P bus system, there is provision for the two DC supply voltages from the two conductor pairs (4 conductors, that is to say two conductor pairs) to be combined in the remote device/the device to be provided with the supply (load module). This is possible, by way of example, when the use (supply by or by means of the load module) of external sensors or, respectively, actuators is correspondingly limited. An advantage in this case is the lower (half) resistance of the supply and data line.

In one embodiment, particularly when the apparatus is provided for an EtherCAT P bus system, there is provision for use of a hybrid line, which advantageously allows a further decrease in line resistance.

For reasons relating to EMC and safety, there may be provision and stipulation for the two DC supply voltages not to be permitted to be combined. Accordingly, by way of example, exclusively the first DC supply voltage is available for supplying power to a sensor for supplying to the forwarding.

As a departure therefrom, according to one embodiment, there is provision for the two DC supply voltages to be or, respectively, to have been combined (or connected) both in the supplying device (=supply module) and in the forwarding node(s) (=apparatus(es) for range extension for a combined data and power line). As a result, the combined DC supply voltage advantageously effectively sees only one half of an electrical resistance of the line.

In a hybrid line, the additional (in addition to the four lines for the two data signals and the two DC supply voltages) lines are normally provided so as to have a much larger conductor cross section than the EtherCAT lines (for example 1.5 mm$^2$ in comparison with 0.34$^2$). Accordingly, the voltage drop in this case is even smaller.

Besides the primary aim of range extension, further advantages can also additionally be seen in an improvement in a diagnosis capability of the bus system, because each apparatus is able, when there is an ammeter or, respectively, a voltmeter or, respectively, a thermometer, to make the applicable measured values available remotely by or by means of the data signal(s), so that the voltages, currents and temperatures can be monitored and checked remotely. As a result of the processing unit, the apparatus is thus an active subscriber of the bus system, which means that individual combined data and power lines can be checked, in particular continuously.

The advantage of combined data and power transmission, particularly in the case of copper-based combined data and power transmission, is particularly that it also allows one or more DC supply voltages to be transmitted at the same time as the data transmission. Said voltages are used, according to one embodiment, for a range extension in order to refresh a transmission signal (in this case the first or, respectively, second differential data signal). This encompasses particularly that the range of a bus system can be increased, particularly multiplied, using combined data and power transmission, the maximum achievable length being dependent exclusively on a supply of power via the bus system.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. An apparatus for range extension for a combined data and power line, comprising:
    a first port for connecting a first combined data and power line, wherein the first port has a first and a second electrical contact,
    a first charge pump for refreshing a DC voltage, wherein the first charge pump is connected via a first inductive assembly to the first and the second contact of the first port, so that the first charge pump can refresh a first DC supply voltage applied to the first and to the second contact of the first port,
    a second port for connecting a second combined data and power line, wherein the second port has a first and a second electrical contact,
    wherein the first charge pump is connected via a second inductive assembly to the first and the second contact of the second port in order to apply the refreshed first DC supply voltage to the first and to the second contact of the second port,
    a first physical interface for receiving a first differential data signal, wherein the first physical interface is connected via a first transformer and a first capacitive assembly to the first and the second contact of the first port in order to receive a first differential data signal applied to the first contact and the second contact of the first port, and
    a second physical interface connected to the first physical interface for providing the first differential data signal, wherein the second physical interface is connected via a second transformer and a second capacitive assembly to the first and the second contact of the second port in order to apply the first differential data signal to the first contact and to the second contact of the second port.

2. The apparatus according to claim 1, wherein the first physical interface and the second physical interface are connected by a processing unit for processing the first differential data signal.

3. The apparatus according to claim 2, wherein a voltmeter for measuring a voltage applied to the first and to the second contact of the first port is provided, and wherein the processing unit is configured to insert a first voltage value corresponding to the measured voltage into the first differential data signal.

4. The apparatus according to claim 2, wherein an ammeter for measuring an electric current corresponding to a voltage applied to the first and to the second contact of the first port is provided, and wherein the processing unit is configured to insert a first current value corresponding to the measured electric current into the first differential data signal.

5. The apparatus according to claim 2, wherein a thermometer for measuring a temperature of one of the electronic elements of the apparatus is provided, and wherein the processing unit is configured to insert a temperature value corresponding to the measured temperature into the first differential data signal.

6. The apparatus according to claim 2, wherein the processing unit is configured to refresh the first differential data signal.

7. The apparatus according to claim 1, wherein refreshing of the first DC supply voltage by the first charge pump is configured to be able to be switched on and off.

8. The apparatus according to claim 1, wherein refreshing of the first DC supply voltage by the first charge pump is configured to be able to be switched on and off, and wherein a processing unit is configured to control the switching-on and switching-off.

9. The apparatus according to claim 1, wherein a power supply unit for supplying the first charge pump with electric power is provided.

10. The apparatus according to claim 1, wherein the first charge pump is configured to refresh the first DC supply voltage only when the first DC supply voltage is lower than or lower than/the same as a predetermined first supply voltage threshold value.

11. The apparatus according to claim 1,
wherein the first port has a third and a fourth contact,
wherein a second charge pump is connected via a third inductive assembly to the third and the fourth contact of the first port, so that the second charge pump can refresh a second DC supply voltage applied to the third and to the fourth contact of the first port,
wherein the second port has a third and a fourth electrical contact,
wherein the second charge pump is connected via a fourth inductive assembly to the third and the fourth contact of the second port in order to apply the refreshed second DC supply voltage to the third and to the fourth contact of the second port,
wherein the first physical interface is connected via a third transformer and a third capacitive assembly to the third and the fourth contact of the first port in order to receive a second differential data signal applied to the third contact and the fourth contact of the first port, and
wherein the second physical interface is connected via a fourth transformer and a fourth capacitive assembly to the third and the fourth contact of the second port in order to apply the second differential data signal to the third contact and to the fourth contact of the second port.

12. A method for range extension for a combined data and power line, comprising the following steps:
applying a first DC supply voltage to a first and to a second contact of a first port for connecting a first combined data and power line,
refreshing the first DC supply voltage applied to the first and to the second contact of the first port,
applying the refreshed first DC supply voltage to a first and to a second contact of a second port for connecting a second combined data and power line,
receiving a first differential data signal applied to the first contact and the second contact of the first port, and
applying the first differential data signal to the first contact and to the second contact of the second port.

13. The method according to claim 12,
wherein a first charge pump refreshes the DC voltage,
wherein the first charge pump is connected via a first inductive assembly to the first and the second contact of the first port, so that the first charge pump can refresh a first DC supply voltage applied to the first and to the second contact of the first port, and
wherein the first charge pump is connected via a second inductive assembly to the first and the second contact of the second port in order to apply the refreshed first DC supply voltage to the first and to the second contact of the second port.

14. The method according to claim 12,
wherein a first physical interface receives the first differential data signal,
wherein the first physical interface is connected via a first transformer and a first capacitive assembly to the first and the second contact of the first port in order to receive a first differential data signal applied to the first contact and the second contact of the first port, and
wherein a second physical interface is connected via a second transformer and a second capacitive assembly to the first and the second contact of the second port in order to apply the first differential data signal to the first contact and to the second contact of the second port.

15. The method according to claim 12, wherein a voltmeter measures a voltage applied to the first and to the second contact of the first port, and wherein a processing unit inserts a first voltage value corresponding to the measured voltage into the first differential data signal.

16. The method according to claim 12, wherein an ammeter measures an electric current corresponding to a voltage applied to the first and to the second contact of the first port, and wherein a processing unit inserts a first current value corresponding to the measured electric current into the first differential data signal.

17. The method according to claim 12, wherein a thermometer that measures a temperature of one of the electronic elements of the apparatus is provided, and a processing unit inserts a temperature value corresponding to the measured temperature into the first differential data signal.

18. The method according to claim 12, wherein a processing unit refreshes the first differential data signal.

19. The method according to claim 12, wherein the first DC supply voltage is refreshed only when the first DC supply voltage is lower than or lower than/the same as a predetermined first supply voltage threshold value.

20. A bus system, comprising: a supply module for supplying a first DC supply voltage and a first differential data signal to a first combined data and power line, an apparatus for connect the first combined data and power line to a second combined data and power line, and a load module for receiving the first DC supply voltage and the first differential data signal from the second combined data and power line, wherein the apparatus comprising: a first charge pump for refreshing the DC voltage, a first port for connecting the first combined data and power line, wherein the first port has a first and a second electrical contact, wherein the first charge pump is connected via a first inductive assembly to the first and the second contact of the first port, so that the first charge pump can refresh a first DC supply voltage applied to the first and to the second contact of the first port, a second port for connecting the second combined data and power line, wherein the second port has a first and a second electrical contact, wherein the first charge pump is connected via a second inductive assembly to the first and the second contact of the second port in order to apply the refreshed first DC supply voltage to the first and to the second contact of the second port, a first physical interface for receiving the first differential data signal, wherein the first physical interface is connected via a first transformer and a first capacitive assembly to the first and the second contact of the first port in order to receive a first differential data signal applied to the first contact and the second contact of the first port, and a second physical interface connected to the first physical interface for providing the first differential data signal, wherein the second physical interface is connected via a second transformer and a second capacitive assembly to the first and the second contact of the second port in order to apply the first differential data signal to the first contact and to the second contact of the second port.

21. The bus system according to claim 20, wherein the first physical interface and the second physical interface are connected by a processing unit for refreshing the first differential data signal.

22. The bus system according to claim 20, wherein refreshing of the first DC supply voltage by the first charge pump is configured to be able to be switched on and off.

23. The bus system according to claim 20, wherein refreshing of the first DC supply voltage by the first charge pump is configured to be able to be switched on and off, wherein a processing unit is configured to control the switching-on and switching-off.

24. The bus system according to claim 20, wherein a power supply unit for supplying the first charge pump with electric power is provided.

25. The bus system according to claim 20, wherein the first charge pump is configured to refresh the first DC supply voltage only when the first DC supply voltage is lower than or lower than/the same as a predetermined first supply voltage threshold value.

* * * * *